United States Patent [19]
Ono

[11] Patent Number: 5,089,740
[45] Date of Patent: Feb. 18, 1992

[54] DISPLACEMENT GENERATING APPARATUS

[75] Inventor: Tomio Ono, Kanagawa, Japan

[73] Assignee: Kabushiki Kaisha Toshiba, Kawasaki, Japan

[21] Appl. No.: 505,131

[22] Filed: Apr. 5, 1990

[30] Foreign Application Priority Data

Apr. 12, 1989 [JP] Japan .................. 1-090620

[51] Int. Cl.$^5$ ........................... H01L 41/08
[52] U.S. Cl. ........................ 310/328; 310/323
[58] Field of Search ................. 310/328, 323

[56] References Cited

U.S. PATENT DOCUMENTS

| | | | |
|---|---|---|---|
| 3,569,718 | 3/1971 | Borner | 310/328 X |
| 3,760,203 | 9/1973 | Gunteisdorfer et al. | 310/331 X |
| 3,835,338 | 9/1974 | Martin | 310/331 |
| 3,928,778 | 12/1975 | Ivanov et al. | 310/331 |
| 4,570,096 | 2/1986 | Hara et al. | 310/328 |
| 4,651,046 | 3/1987 | Ohya et al. | 310/328 |
| 4,678,955 | 7/1987 | Toda | 310/328 |
| 4,686,440 | 8/1987 | Hatamura et al. | 310/331 X |
| 4,785,177 | 11/1988 | Besacke | 310/328 |
| 4,786,837 | 11/1988 | Kalnin et al. | 310/364 |
| 4,798,989 | 1/1989 | Miyazaki et al. | 310/328 |
| 4,877,957 | 10/1989 | Okada et al. | 250/306 |
| 4,884,003 | 11/1989 | Hayes | 310/328 |
| 4,928,030 | 5/1990 | Culp | 310/328 |
| 4,947,077 | 8/1990 | Murata | 310/328 |

FOREIGN PATENT DOCUMENTS

| | | | |
|---|---|---|---|
| 0081984 | 4/1987 | Japan | 310/323 |
| 0147976 | 7/1987 | Japan | 310/328 |
| 0214413 | 9/1987 | Japan | 310/328 |
| 0615582 | 6/1978 | U.S.S.R. | 310/328 |

*Primary Examiner*—Steven L. Stephan
*Assistant Examiner*—Thomas M. Dougherty
*Attorney, Agent, or Firm*—Oblon, Spivak, McClelland, Maier & Neustadt

[57] ABSTRACT

A displacement generating apparatus having a gate-shaped structure is provided in which a plurality of bimorph-type piezoelectric elements are employed. The gate-shaped apparatus has high rigidity and a high resonance frequency, and can produce a carrying force greater than that of the conventional counterpart. Thus, the apparatus can move a heavier object at a high speed very accurately.

3 Claims, 10 Drawing Sheets

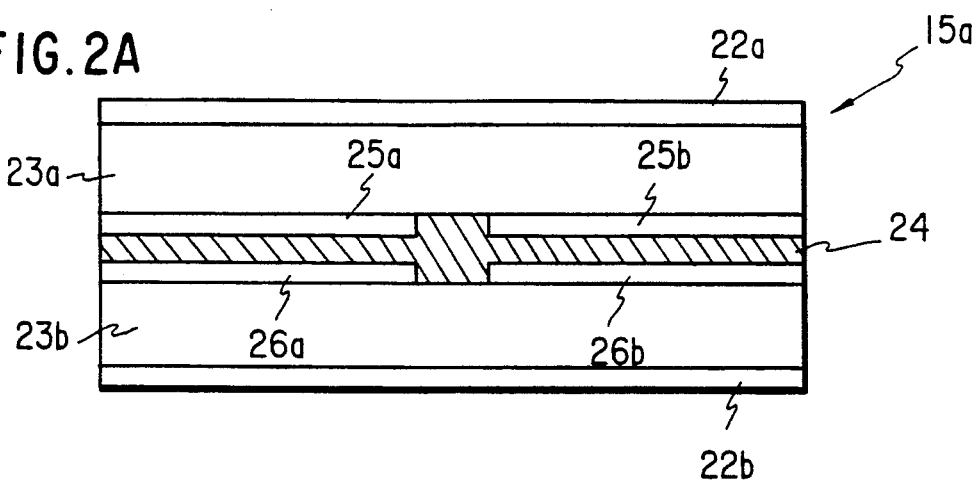
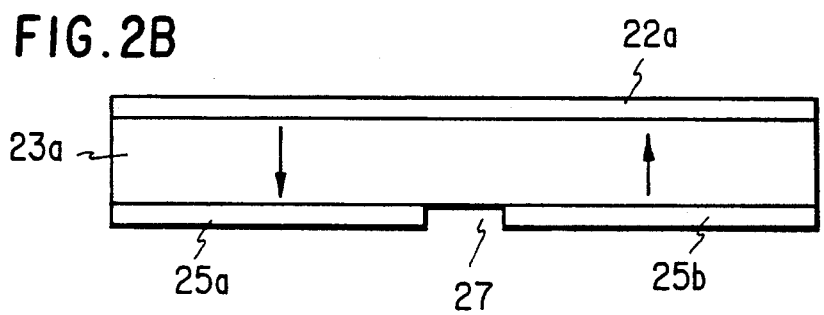
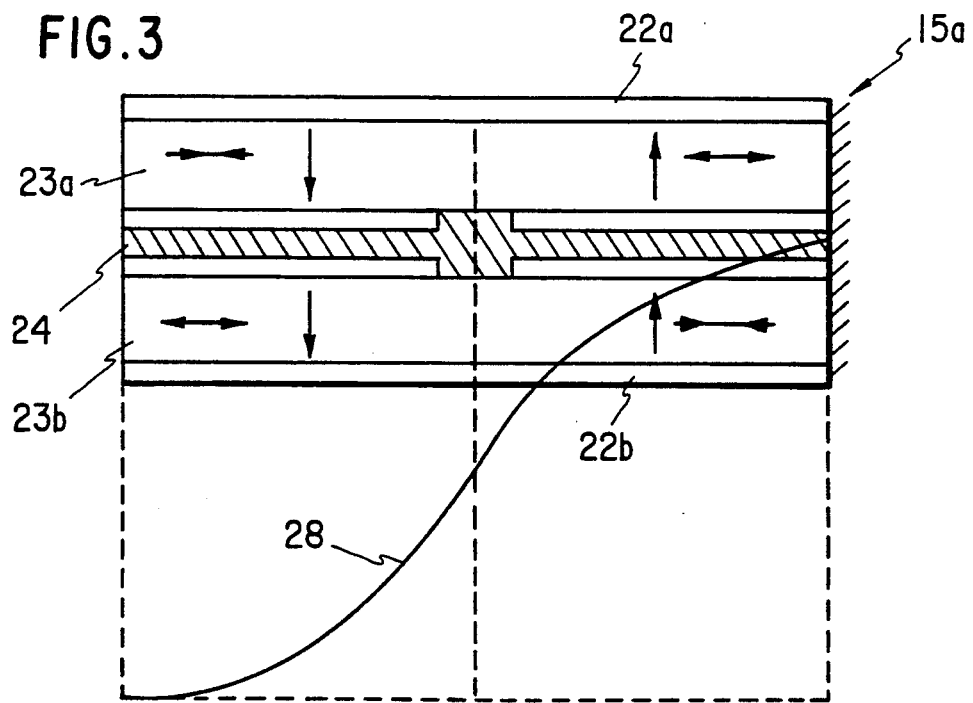

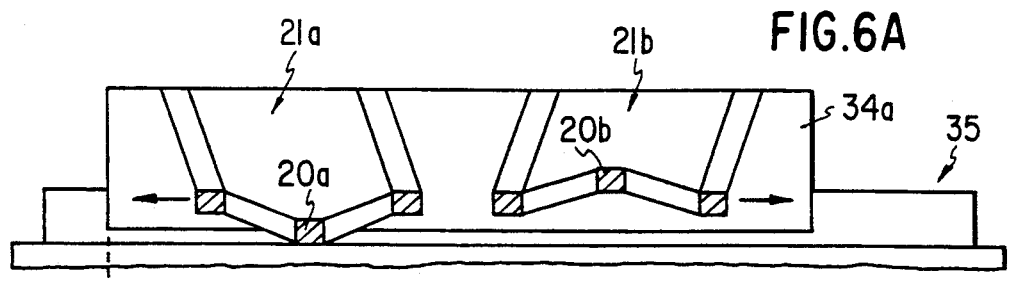
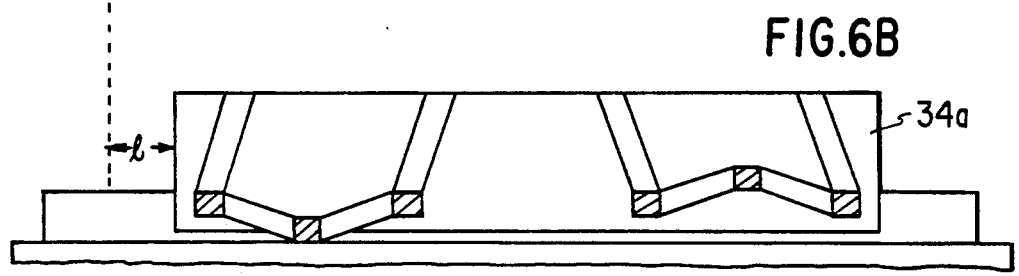
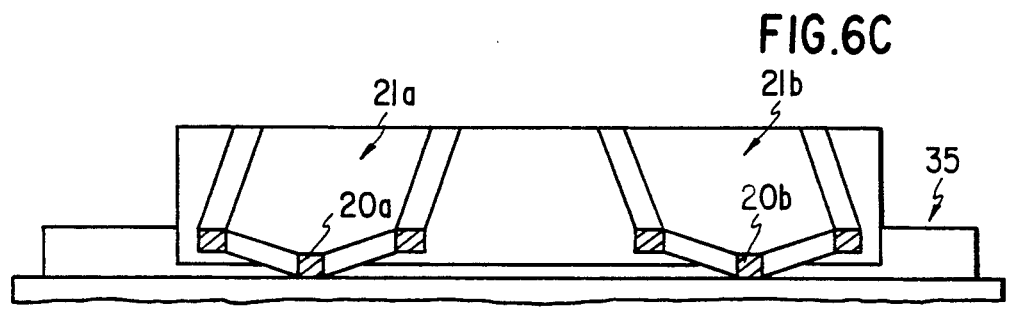
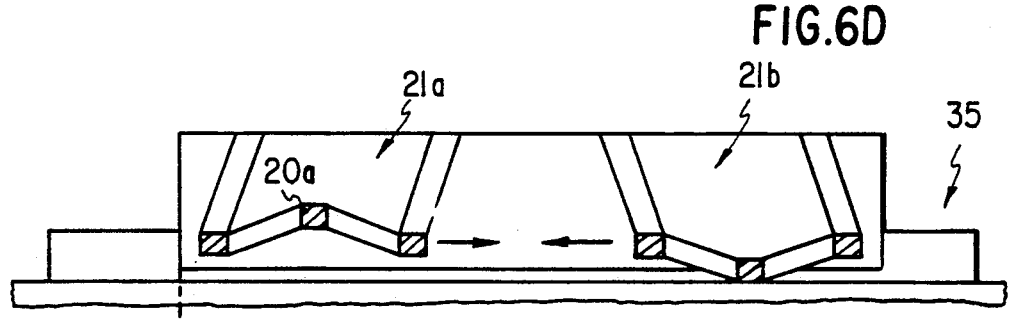
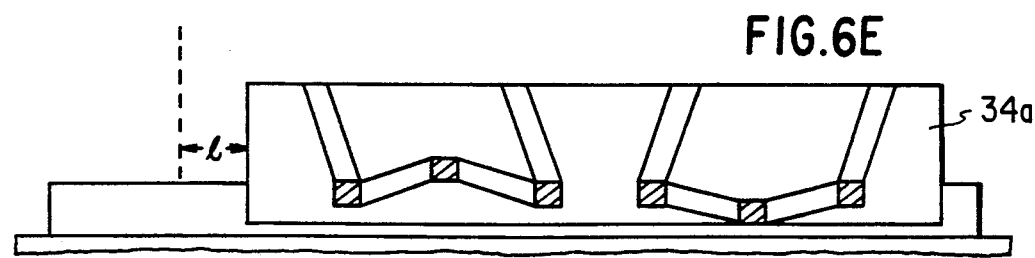

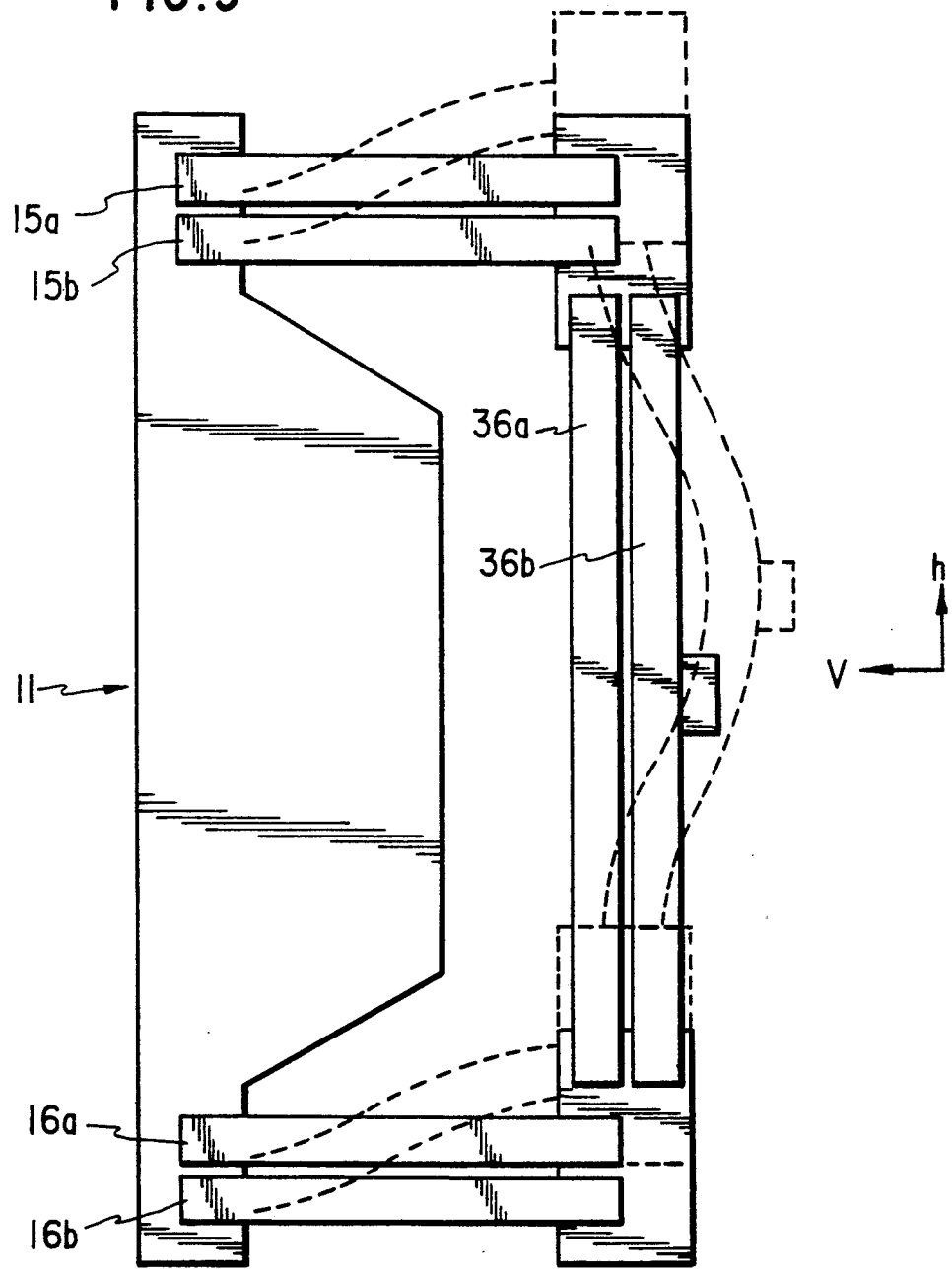

DISPLACEMENT GENERATING APPARATUS

BACKGROUND OF THE INVENTION

1. Field of the Invention

This invention relates to a displacement generating apparatus, and more particularly to a displacement generating apparatus in which bimorph-type piezoelectric elements are employed.

2. Description of the Prior Art

Conventionally, piezoelectric elements have been widely used as actuators in precise positioning applications where displacements of the order of microns and submicrons are desired. This is because such minute displacements can be relatively easily obtained by controlling voltages applied across the elements. However, when relatively large displacements are desired, such elements cannot be used without modifications. For example, in an application of a so-called STM (scanning tunneling microscope), a universal stage on which an object to be observed is placed is positioned in the following manner. First, a coarse positioning and then a fine positioning are cooperatively performed. However, the displacement of a piezoelectric element is too small to achieve the coarse positioning. Thus, other particular coarse positioning apparatus must be additionally provided. To solve this problem, an inchworm actuator has been used. The operational principle of the inchworm actuator is similar to that of the human waling operation. Specifically, the inchworm actuator operation is based on the combination of vertical and horizontal movements.

FIG. 10 shows a conventional displacement generating apparatus for use in an inchworm actuator application. In FIG. 10, v represents a vertical direction, and h represents a horizontal direction. The conventional apparatus has two pairs of bimorph-type piezoelectric elements 2a and 2b, and 3a and 3b, respectively adhered to an L-shaped elastic member 1. The pair of elements 2a and 2b serve to move in the vertical direction, and the pair of elements 3a, and 3b serve to move in the horizontal direction. One end of the member 1 is fixed to a support member 4, and the other end of the member 1 has a displacement force transmitting adapter 5. Further, a pair of electrodes 8a and 8b are formed on the outer sides of the elements 2a and 2b. Similarly, a pair of electrodes 9a and 9b are formed on the outer sides of the elements 3a and 3b. These elements 2a, 2b, 3a and 3b have been polarized in the directions indicated by arrows shown in FIG. 10. The electrodes 8a and 8b are respectively connected to a vertical-direction drive power source 7a through leads 6c and 6d. The electrodes 9a and 9b are respectively connected to a horizontal-direction drive power source 7b through leads 6e and 6f. The L-shaped elastic member 1, which also serves as a common electrode, is connected to the power sources 7a and 7b through leads 6a and 6b, respectively. When voltages Vv and Vh are supplied from the power sources 7a and 7b to the elements 2a, 2b, 3a and 3b, the member 1 is deformed on the whole into a shape indicated by a dotted line shown in FIG. 10. In other words, the apparatus generates displacements such that the adapter 5 simultaneously displacements such that the adapter 5 and a horizontal-direction displacement. These displacements are controlled by the voltages Vv and Vh. A plurality of the above-described displacement generating apparatus constitute a conventional inchworm actuator.

As described above, the conventional displacement generating apparatus is basically of a cantilever structure. Thus, the apparatus has low rigidity and a low resonance frequency, and can produce only a small force. Further, the displacement force transmitting adapter 5 inevitably moves in a rotational direction. Thus, the adapter 5 cannot be moved independently in the vertical and horizontal directions. Therefore, when this apparatus is employed in an inchworm actuator, certain disadvantages arise. Specifically, the inchworm actuator can carry only a lightweight object at a low speed. Further, the positioning of the object cannot be accurately performed.

SUMMARY OF THE INVENTION

Accordingly, one object of this invention is to provide a displacement generating apparatus that can move a displacement force transmitting adapter independently in the vertical and horizontal directions. The apparatus can also generate a displacement force greater than that in the conventional apparatus. Further, the apparatus can achieve the precise positioning of an object at a high speed.

Briefly, in accordance with one aspect of this invention, there is provided a displacement generating apparatus which comprises first and second displacement generating devices, one end of each of said first and second devices being fixed to a common member, the first and second devices having substantially the same length and being arranged parallel to each other, and third displacement generating device having a displacement force transmitting member in substantially the center thereof, the third device being attached to the other end of each of the first and second devices such that the third device is arranged perpendicular to the first and second devices.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is a schematic cross-sectional view illustrating a bimorph-type piezoelectric element employed in the first embodiment shown in FIG. 1;

FIG. 2B is a schematic cross-sectional view for explaining the process of polarizing one of piezoelectric sheets that constitute the element shown in FIG. 2A;

FIG. 3 is a diagram for explaining the operation of the element shown in FIG. 2A;

FIGS. 6A through 6G are schematic diagrams for explaining the operation of the second embodiment shown in FIG. 5A;

FIG. 9 is a plan view illustrating the structure and operation of a fourth embodiment according to the present invention.

DESCRIPTION OF THE PREFERRED EMBODIMENTS

Figure 1:
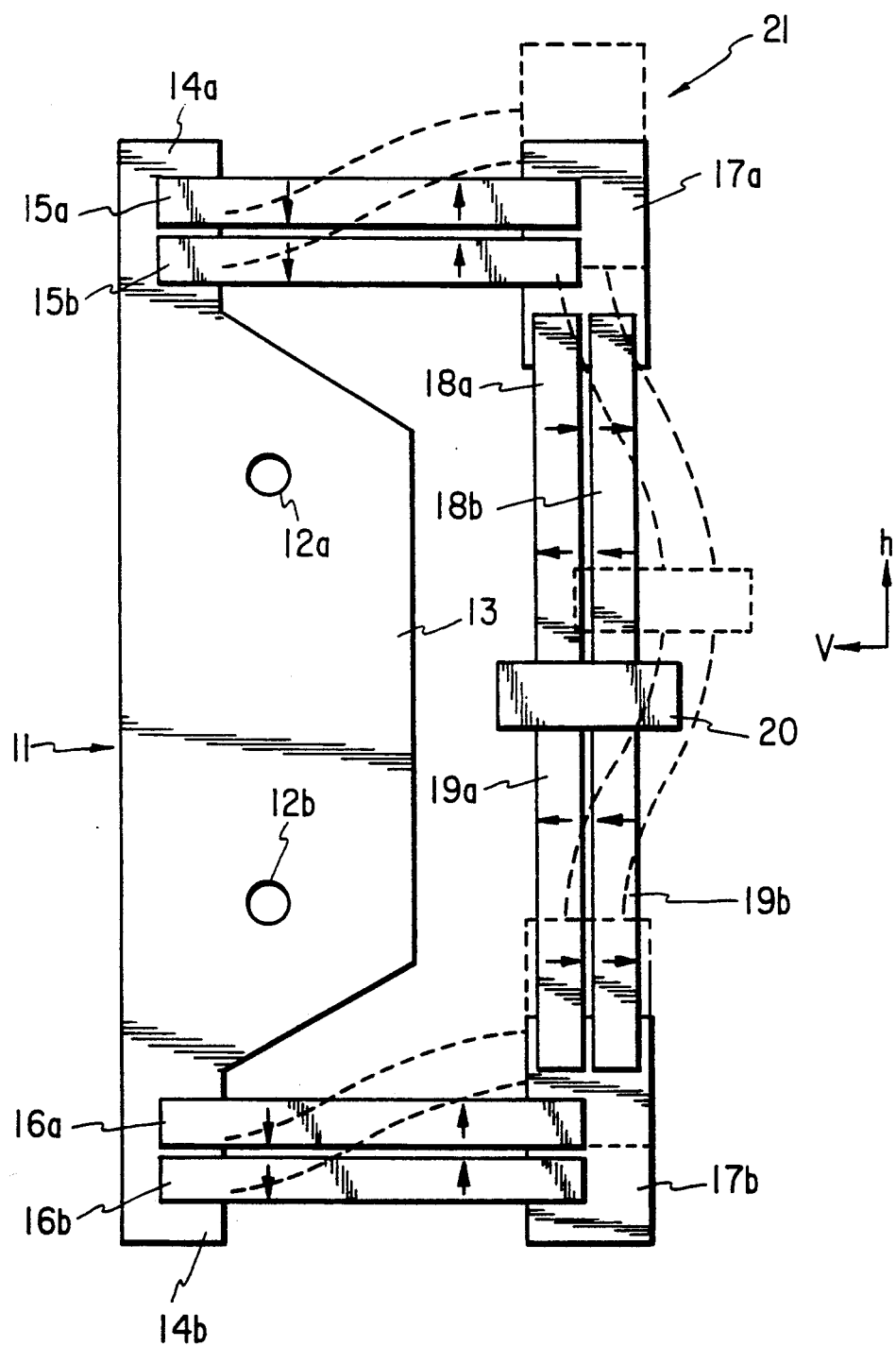
FIG. 1 is a plan view illustrating the structure and operation of a first embodiment according to the present invention.

Referring now to the drawings, wherein like reference numerals designate identical or corresponding parts throughout the several views, and more particularly to FIG. 1 thereof, a first embodiment of this invention will be described.

In FIG. 1 arrows h and v indicate a horizontal direction and a vertical direction, respectively. A support member 11 comprises a wide central portion 13 having a pair of screw holes 12a and 12b, and narrow end portions 14a and 14b. A pair of first and second bimorph-type piezoelectric elements 15a and 15b are arranged in parallel to each other. One end of each of the elements 15a and 15b is fixed to the end portion 14a of the support member 11. The other end of each of the elements 15a and 15b is fixed to a first connecting member 17a.

A pair of third and fourth bimorph-type piezoelectric elements 16a and 16b are arranged in parallel to each other. One end of each of the elements 16a and 16b is fixed to the end portion 14b of the support member 11. The other end of each of the elements 16a and 16b is fixed to a second connecting member 17b. The first and second elements 15a and 15b are disposed in parallel with respect to the third and fourth elements 16a and 16b. Further, a pair of fifth and sixth bimorph-type piezoelectric elements 18a and 18b are arranged in parallel to each other. One end of each of the elements 18a and 18b is fixed to the first connecting member 17a. The other end of each of the elements 18a and 18b is fixed to a displacement force transmitting adapter 20. A pair of seventh and eighth bimorph-type piezoelectric elements 19a and 19b are arranged in parallel to each other. One end of each of the elements 19a and 19b is fixed to the second connecting member 17b. The other end of each of the elements 19a and 19b is fixed to the displacement force transmitting adapter 20. The fifth and sixth elements 18a and 18b are disposed perpendicularly to the first and second elements 15a and 15b. Similarly, the seventh and eight elements 19a and 19b are disposed perpendicularly to the third and fourth elements 16a and 16b. The fifth and sixth elements 18a and 18b and the seventh and eighth elements 19a and 19b are arranged along a straight line intersecting the adapter 20. Further, the first through eighth elements 15a through 19b are made of the same material, and are equal in size to each other. As a result, a displacement generating apparatus 21 can be obtained as shown in FIG. 1. The apparatus 21 is shaped like a gate, having the support member 11 as a base.

The first through eighth bimorph-type piezoelectric elements 15a through 19b have been individually polarized in the respective directions indicated by arrows shown in FIG. 1. A plurality of electrodes (not shown for simplicity) are formed on both sides of the respective elements 15a through 19b. When prescribed voltages are applied across the respective electrodes, the displacement generating apparatus 21 is deformed into a shape indicated by dotted lines shown in FIG. 1.

FIG. 2A is a schematic cross-sectional view illustrating the structure of one of the bimorph-type piezoelectric elements 15a through 19b shown in FIG. 1. Specifically, in FIG. 2A, the element 15a has a pair of piezoelectric sheets 23a and 23b. Electrodes 22a and 22b are formed on the outer surfaces of the sheets 23a and 23b, respectively. Divided electrodes 25a, 25b, 26a and 26b are formed on the inner surfaces of the sheets 23a and 23b, respectively. The sheets 23a and 23b with the above-described electrodes are adhered to either side of a common electrode 24, which also serves as an elastic member. The divided electrodes 25a through 26b are used only when the process of polarizing the sheets 23a and 23b is performed (described later in detail). Other than the polarization, the divided electrodes 25a through 26b provide no other function. In other words, the divided electrodes 25a through 26b can be regarded as being incorporated into a part of the common electrode 24.

FIG. 2B is a diagram for explaining the process of polarizing the sheet 23a, for example. In FIG. 2B, a central space 27 is provided between the divided electrodes 25a and 25b. Assume that voltages having different polarities and being higher than the normal operating voltage are applied across the electrode 22a and the divided electrodes 25a and 25b, respectively. The application of these voltages causes the piezoelectric sheet 23a to be polarized in the directions indicated by arrows shown in FIG. 2B. Specifically, the sheet 23a is polarized in the two opposite directions defining the central space 27 as a boundary.

As described above, the divided electrodes 25a and 25b are used only in this polarization process.

FIG. 3 is a diagram illustrating the displacements of the bimorph-type piezoelectric element 15a when the operating voltage is supplied thereto. In FIG. 3, the pair of piezoelectric sheets 23a and 23b have been polarized in the vertical directions indicated by arrows. Assume that the operating voltage is applied across the common electrode (elastic member) 24 and the electrodes 22a and 22b. Specifically, the left portion of the sheet 23a receives a voltage having a polarity reverse to its own polarized direction. Thus, the left portion of the sheet 23a shrinks. The right portion of the sheet 23a receives a voltage having a polarity identical to its own polarized direction. Thus, the right portion of the sheet 23a expands. The left portion of the sheet 23b receives a voltage having a polarity identical to its own polarized direction. Thus, the left portion of the sheet 23b expands. The right portion of the sheet 23b receives a voltage having a polarity reverse to its own polarized direction. Thus, the right portion of the sheet 23b shrinks.

As a result, the element 15a is deformed in such a manner that the locus of points on the center line of the elastic member 24 becomes a continuous curve 28, as shown in FIG. 3. As can be seen from this locus, the significant advantage of the element 15 is in that the free end (the left end in FIG. 3) of the element 15 can make a parallel translation.

Figure 4:
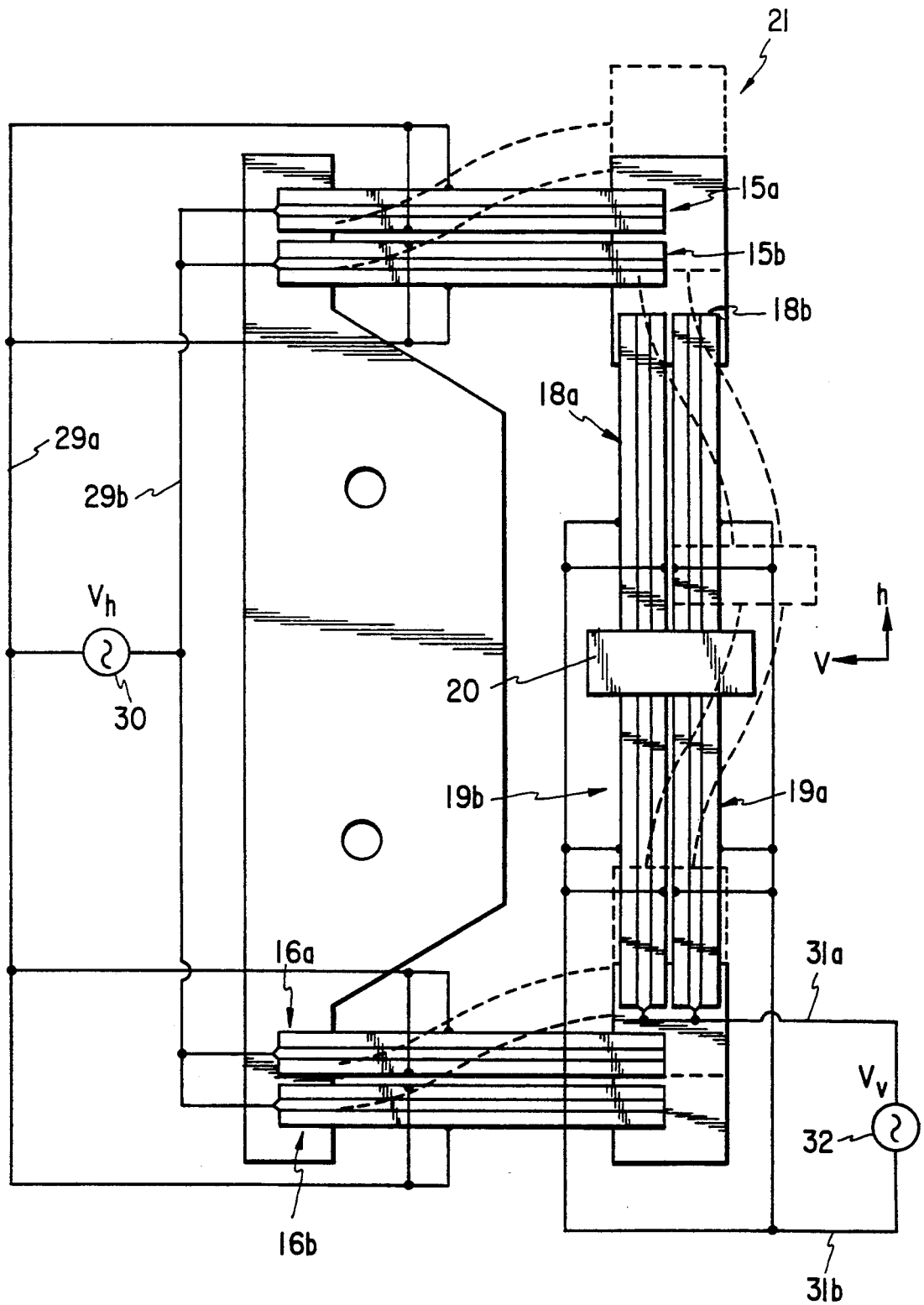
FIG. 4 is a wiring diagram of the first embodiment shown in FIG. 1.

The wiring of the displacement generating apparatus 21 shown in FIG. 1 will be described with reference to FIG. 4. For the sake of simplicity, the detailed structures of each of the bimorph-type piezoelectric elements 15a through 19b are not illustrated in FIG. 4 (refer to FIG. 2A for detail). The respective electrodes and common electrodes (elastic members) of the elements 15a, 15b, 16a and 16b are connected to a horizontal-direction drive power source 30 through leads 29a and 29b. The respective electrodes and common electrodes (elastic members) of the elements 18a, 18b, 19a and 19b are connected to a vertical-direction drive power source 32 through leads 31a and 31b. When the power sources 30 and 32 supply voltages Vv and Vh simultaneously to the elements 15a through 19b, the apparatus 21 will be deformed as indicated by the dotted lines shown in FIG. 4. In this case, the respective displacements in the vertical and horizontal directions can be controlled independently by the voltages Vv and Vh supplied form the power source 30 and 32. In this element, two bimorph-type piezoelectric sheets are arranged in parallel and constitute each displacement generating element. However, the number of sheets to be arranged in parallel is not limited to this, i.e., any number of sheets may be arranged in parallel depending on a desired displacement force to be generated.

Next, a second embodiment according to the present invention will be described with reference to FIGS. 5A and 5B. In this embodiment, a translation stage apparatus for use in a scanning tunneling microscope (STM) will be described. The apparatus can precisely move an object to be observed in a linear direction by a desired displacement. Specifically, in FIG. 5A, a pair of linear movement bearings 34a and 34b are fixed to the under portion of a rectangular translation stage 33. The stage 33 is slidably supported by a base 35 in the following manner. Specifically, the base 35 has a guide portion 36 and a peripheral portion 37. The linear movement bearings 34a and 34b each have a groove 38 formed on the respective inner surfaces. The guide portion 36 has grooves 39a and 39b formed on both its outer surfaces. A large number of metal balls 40 are inserted in spaces defined both by the grooves 38a and 39a, and 38b and 39b. As a result, the stage 33f can be slidably supported by the base 35 so as to move linearly without vertical movements.

Figure 5A:
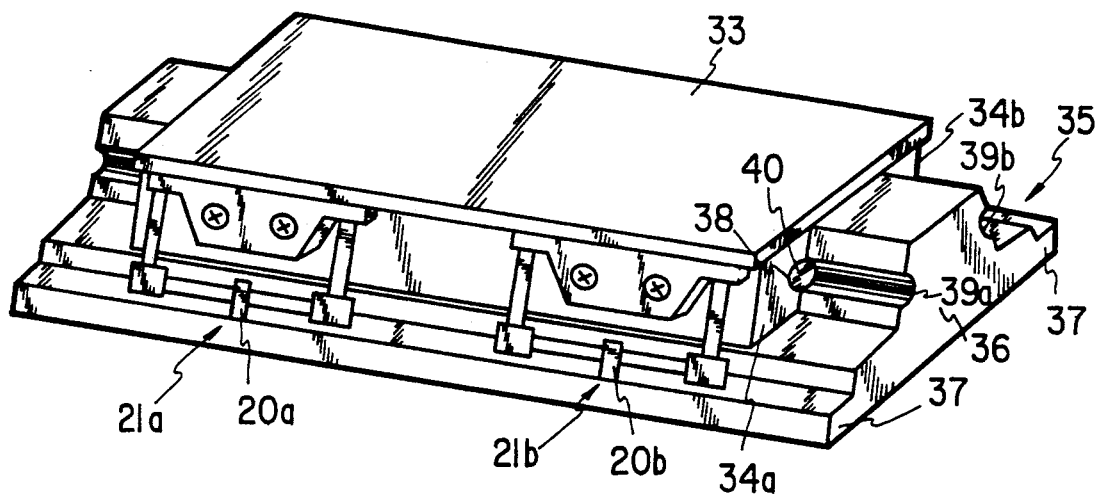
FIG. 5A is a schematic perspective view illustrating a second embodiment according to the present invention.

In FIG. 5A, one of the metal balls 40 can be observed. However, this is only for convenience of explanation, and actually the balls 40 are inserted inside. Further, four displacement generating devices 21a, 21b, 21c and 21d are fixed by screws to the outer sides of the bearings 34a and 34b. These devices 21a through 21d have the same structure as that of the displacement generating apparatus 21 shown in FIG. 1. The devices 21a through 21d are respectively provided with displacement force transmitting adapters on surface contact member 20a, 20b, 20c and 20d. When prescribed voltages are supplied to the devices 21a through 21d, the adapters 20a through 20d cause the stage 33 to move along the guide portion 36 in the following manner.

Figure 5B:
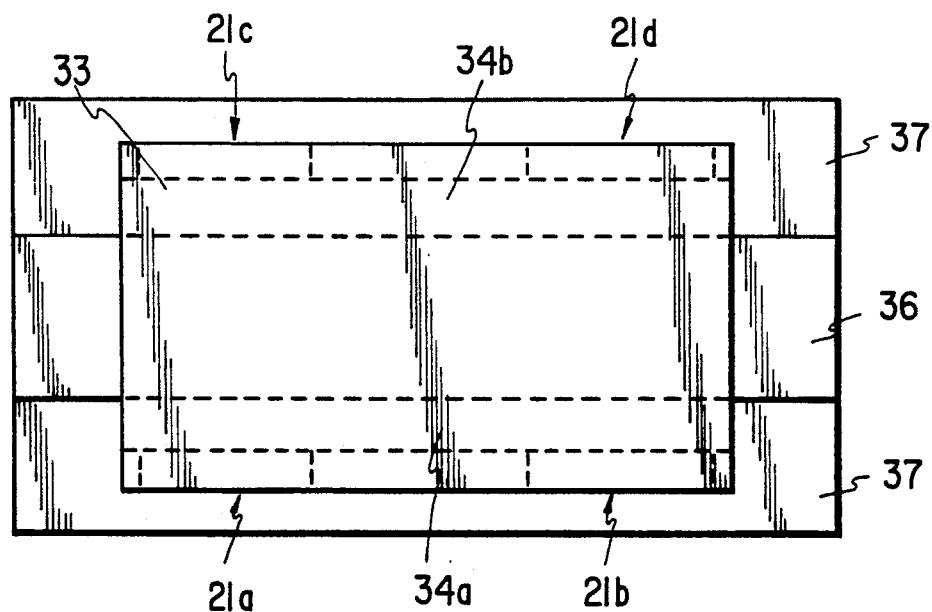
FIG. 5B is a top view illustrating the essential portion of the second embodiment shown in FIG. 5A.
Figure 6F:
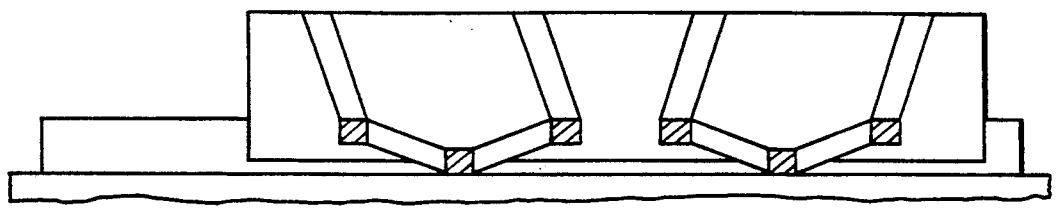
Figure 6G:
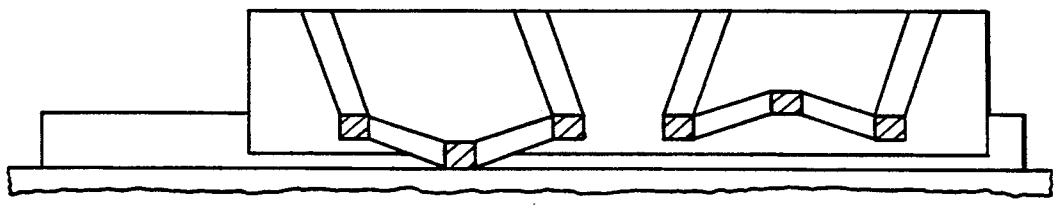

FIGS. 6A through 6G schematically illustrate a first operation of the second embodiment of this invention shown in FIGS. 5A and 5B. In FIGS. 6A through 6G, only the movements of the displacement generating devices 21a and 21b are illustrated. However, the movements of the displacement generating device 21c and 21d are performed in the same manner as those of the respective corresponding devices 21a and 21b. For convenience of explanation, designate the devices 21a and 21b as a first device 21a and a second device 21b, respectively. Similarly, designate the adapters 20a and 20b a first adapter 20a and a second adapter 20b as, respectively. In FIG. 6A, the first adapter 20a of the first device 21a is in contact with the base 35, and the second adapter 20b of the second device 21b is separated from the base 35. In this state, when the first and second devices 21a and 21b are deformed in the respective directions indicated by arrows, the bearing 34a which is fixed to the stage 33 is moved to the right by a distance l, as shown in FIG. 6B. Next, the second device 21b is operated so that the second adapter 20b comes in contact with the base 35. In this state, both adapters 20a and 20b are in contact with the base 35, as shown in FIG. 6C. Next, the first adapter 20a is separated from the base 35, and the first and second devices 21a and 21b are deformed in the respective directions indicated by arrows shown in FIG. 6D. As a result, the bearing 34a is further moved to the right by a distance l', as shown in FIG. 6E. Thereafter, the above-described movements are repeated as shown in FIGS. 6F and 6G, and the stage 33 is moved to the right. The detailed description of the repetitive movements will be omitted. These repetitive movements allow the bearing 34a, i.e., the stage 33 to move to a desired position.

As described above, in the first operation of the second embodiment, the displacement generating devices 21a and 21b are alternately operated. Thus, the stage 33 can be moved at a relatively fast speed. However, the weight of an object which may be placed on the stage 33 is limited.

Figure 7A:
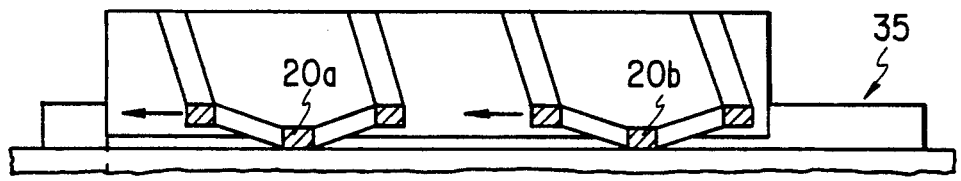
FIGS. 7A through 7H are schematic diagrams for explaining other operations of the second embodiment shown in FIG. 5A.
Figure 7B:
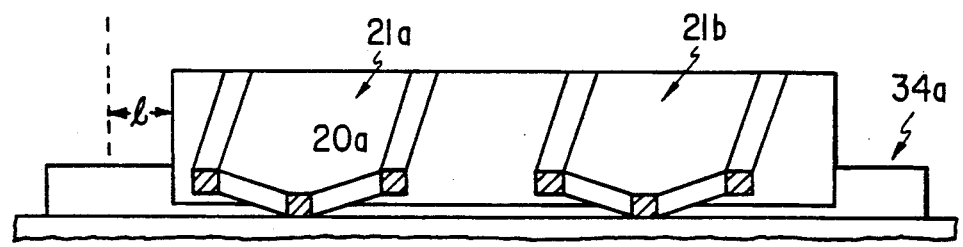
Figure 7C:
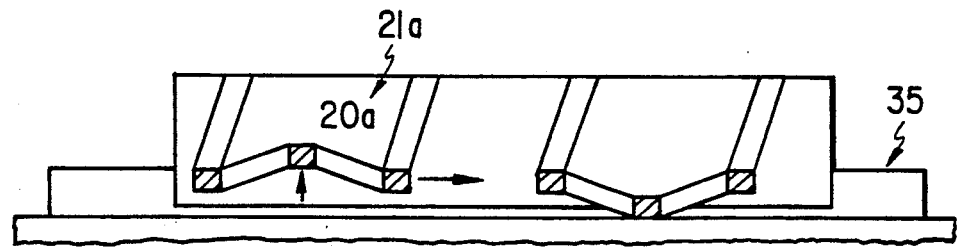
Figure 7D:
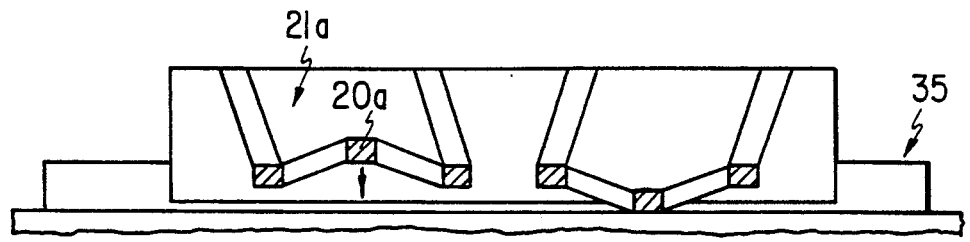
Figure 7E:
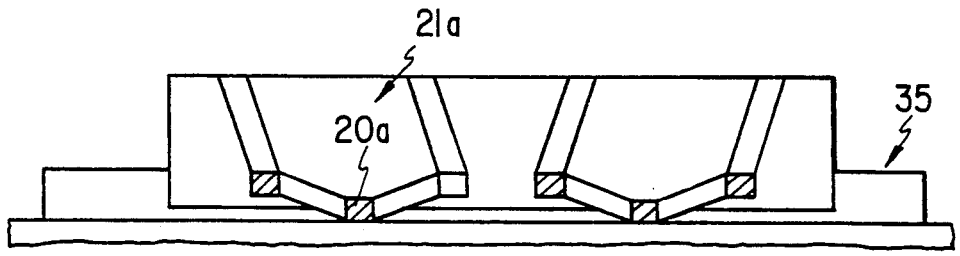
Figure 7F:
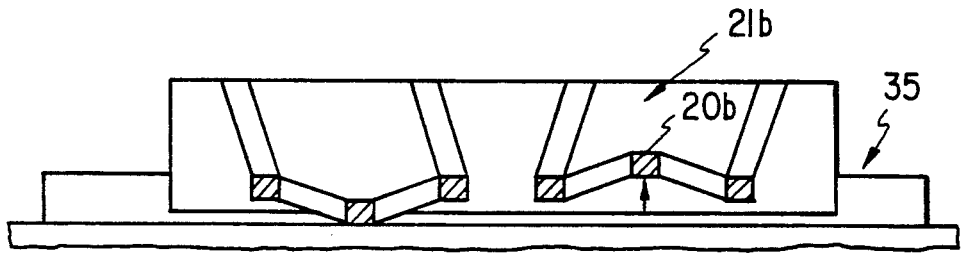
Figure 7G:
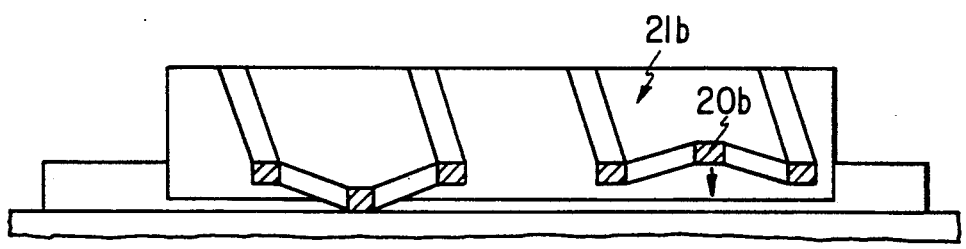
Figure 7H:
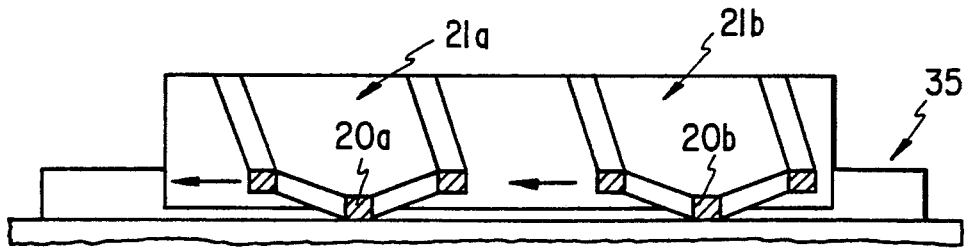

FIGS. 7A through 7H schematically illustrate a second operation of the second embodiment of this invention shown in FIGS. 5A and 5B. In this second operation, the moving speed of the stage 33 is reduced to substantially ½ that of the above first operation. However, the weight that the stage 33 can carry becomes substantially two times that of the above first operation. The detailed description of this second operation will be omitted, and only a brief explanation will be made. In FIG. 7A, the first and second adapters 20a and 20b are simultaneously in contact with the base 35. Next, the first and second devices 21a and 21b are simultaneously moved in the same direction, as indicated by arrows shown in FIG. 7A. As a result, the bearing 34a, i.e., the stage 33, can be moved to the right by a distance l, as shown in FIG. 7B. Thereafter, the first adapter 20a is separated from the base 35, and only the first device 21a is deformed to the right. The first adapter 20a is then caused to be in contact with the base, 35, as shown in FIGS. 7C through 7E. Next, the second adapter 20b is separated from the base 35, and only the second device 21b is deformed to the right. The second adapter 20b is then caused to be in contact with the base 35, as shown in FIGS. 7F through 7H.

As described above, in the second operation of the second embodiment, both the first and second adapters 20a 20b are always in contact with the base 35 while the stage 33 is being moved. Further, one of the first and second adapters 20a and 20b is always in contact with the base 35 while they are deformed as shown in FIG. 7C through 7H. Thus, the stage 33 can be protected from undesirable movements caused by external forces. As a result, precise positioning control of the stage 33 can be achieved. However, if particular care need not be taken with respect to any external forces, the operations of the first adapter 20a in FIGS. 7C through 7E and the operations of the second adapter 20b in FIGS. 7F through 7H may also be performed simultaneously. This allows the stage 33 to move at a speed substantially two times that of the above-mentioned second operation.

Figures 8A, 8B:
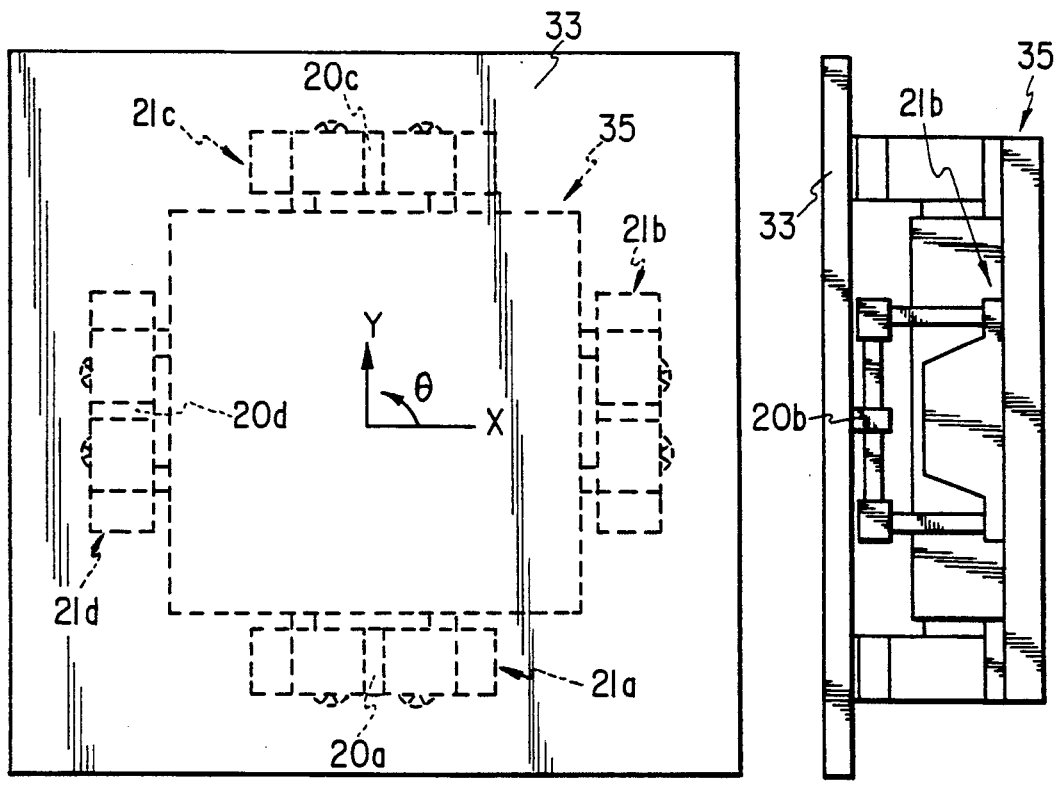
FIG. 8A is a top view illustrating the essential portion of a third embodiment according to the present invention.
FIG. 8B is a side view illustrating the third embodiment shown in FIG. 8A.
Figure 8C:
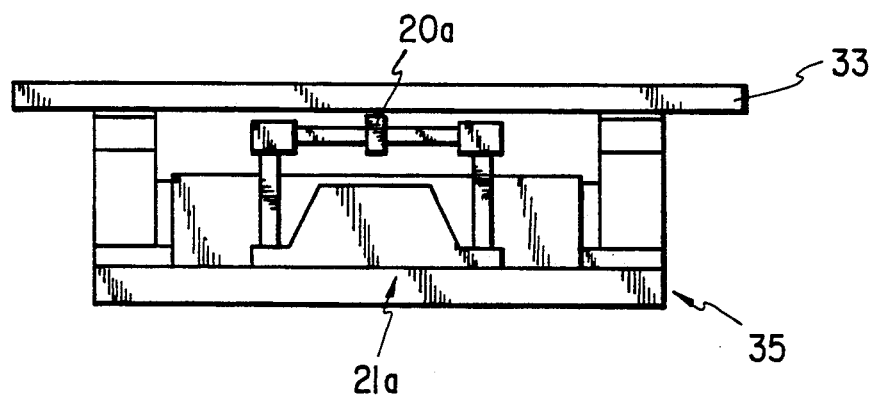
FIG. 8C is a plan view illustrating the third embodiment shown in FIG. 8A.
Figure 10:
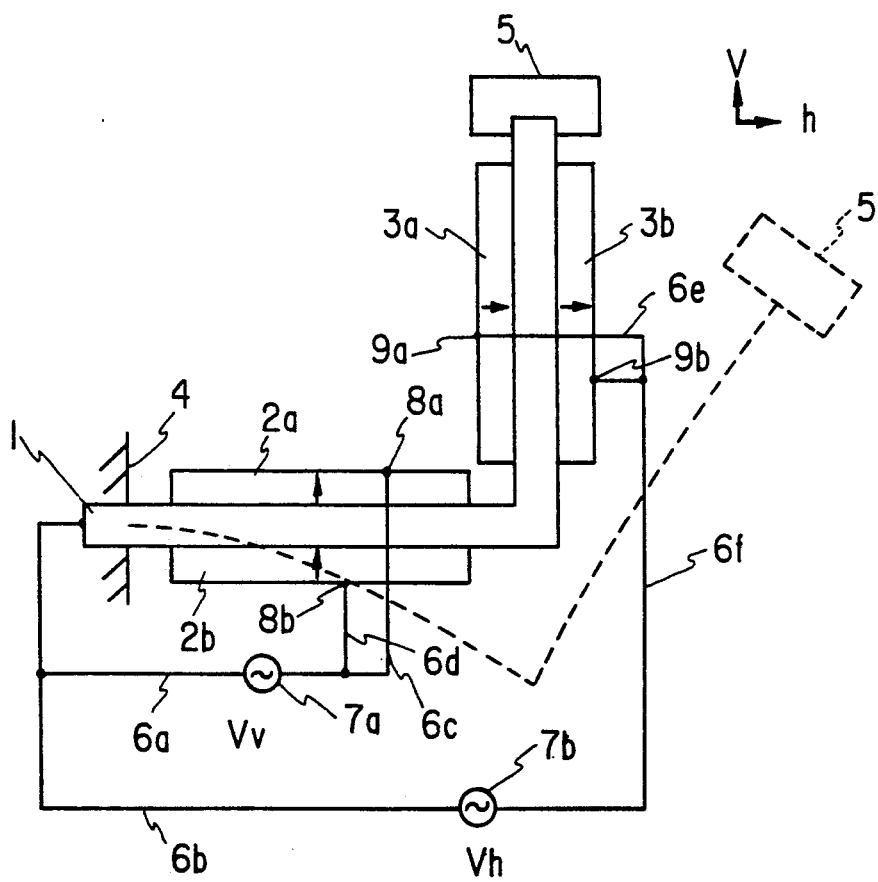
FIG. 10 is a plan view illustrating the structure and operation of a conventional displacement generating apparatus.

Next, a third embodiment according to the present invention will be described with reference to FIGS. 8A through 8C. FIG. 8A shows a displacement generating apparatus that can move a stage 33 not only in a single linear direction (as in the second embodiment), but in the directions of arrows X and Y. In Addition, the apparatus can move the stage 33 in a rotational direction indicated by $\theta$ shown in FIG. 8A. The apparatus of this embodiment differs from the apparatus of the second embodiment in that four displacement generating devices 21a through 21d are fixed to a square-shaped base 35. Specifically, the displacement generating devices 21a through 21d are fixed by screws onto the respective sides of the square-shaped base 35. Thus, four force transmitting adapters 20a through 20d are in contact with the under surface of the stage 33. The stage 33 is engaged with the four adapters 20a through 20d in such a manner that the stage 33 can be moved in the directions X and Y, and the rotational direction $\theta$ in the plane of the stage 33. The engagement of the stage 33 and the adapters 20a through 20d can be achieved by use of magnets, springs and the like. (a detailed illustration of the engagement is omitted)

The apparatus according to the third embodiment performs in the following manners. Specifically, first assume the state in which the stage 33 is engaged with the adapters 20b and 20d, and disengaged from the adapters 20a and 20c. Further, the stage 33 is desired to move in the direction indicated by X shown in FIG. 8A.

(1) The adapters 20a and 20c are moved in the direction X.

(2) The stage 33 is then engaged with the adapters 20a and 20c.

(3) The stage 33 is disengaged from the adapters 20b and 20d.

(4) The adapters 20a and 20c are operated to move the stage 33 in the direction X.

(5) The stage 33 is then engaged with the adapters 20b and 20d.

(6) The stage 33 is disengaged from the adapters 20a and 20c.

The operations (1) through (6) are repeatedly performed.

In the case when the stage 33 is desired to move in the direction indicated by arrow Y shown in FIG. 8A, the operations of the devices 21a and 21c are replaced with the operations of the devices 21b and 21d. Further, when the stage 33 is desired to move in the rotational direction indicated by arrow $\theta$, the device 20b is operated in the direction reverse to the direction in which the device 20d is operated.

In this embodiment, the respective displacement generating devices 21a through 21d serve to move the stage stepwise. However, the apparatus can also move the stage continuously such that the tip of the adapter can achieve an ellipsoidal movement. Further, two stages X and Y can also be constituted by orthogonally overlapping two apparatus of the second embodiment shown in FIGS. 5A and 5B.

Next, a fourth embodiment according to the present invention will be described with reference to FIG. 9. A displacement generating apparatus of this embodiment differs from the apparatus of the first embodiment in the following manners. Specifically, as seen from FIG. 9, two bimorph-type piezoelectric elements 36a and 36b are employed instead of the counterpart elements 18a through 19b of the first embodiment shown in FIG. 1. The elements 36a and 36b are about two times as long as the elements 18a through 19b of the first embodiment. The operation of the apparatus of this embodiment is substantially the same as that in the first embodiment. In this embodiment, the apparatus needs elements of different lengths. However, the apparatus of this embodiment can reduce the bonding portions of the elements. Thus, the apparatus has advantages in terms of strength and smooth movement.

Obviously, numerous additional modifications and variations of the present invention are possible in light of the above teachings. It is therefore to be understood that within the scope of the appended claims, the invention may be practiced otherwise than as specifically described herein.

What is claimed is:

1. A displacement generating apparatus comprising:
    a member to be moved having a linear movement bearing in substantially the center thereof;
    a base being slidably engaged with said bearing such that said base allows said member to be moved to move only in a prescribed linear direction;
    a plurality of displacement generating means provided in equal number on both sides of said member to be moved, said both sides being parallel to the prescribed linear moving direction of said member to be moved;
    said plural displacement generating means being provided at symmetrical positions with respect to said bearing;
    each of said plural displacement generating means including a support fixed to said member to be moved, a pair of first and second means for generating a displacement in a direction substantially transverse to each longitudinal axis thereof and including plural bimorph-type piezoelectric displacement generating elements, said elements of said first and second means being identical to each other in size, shape and material and being arranged parallel to each other such that one end of each of said elements of said first and second means is fixed to said support at positions separated from each other and the other end of each of said elements of said first and second means is fixed to a connecting block, third means for generating a displacement in a direction substantially transverse to a longitudinal axis thereof and including plural bimorph-type piezoelectric displacement generating elements, one end of each of said elements of said third means being connected to the connecting blocks connected to said first and second elements, said elements of said third means having a displacement force transmitting adapter at substantially a center of said third means.

2. The apparatus of claim 1, wherein said plural displacement generating means include four bimorph-type piezoelectric displacement generating devices provided on both sides of said member to be moved.

3. A displacement generating apparatus comprising:
    a base;
    a quadrangular member to be moved engaged with said base such that said quadrangular member makes a parallel translation with respect to said base;

four displacement generating devices respectively fixed to said base at positions corresponding to the respective four sides of said quadrangular member to be moved;

each of said four displacement generating devices including a support fixed to said base, a pair of first and second means, including plural bimorph-type piezoelectric displacement generating elements, said elements of said first and second means being identical to each other in size, shape and material and being arranged parallel to each other such that one end of each of said elements of said first and second means is fixed to said support at positions separated from each other and the other end of each of said elements of said first and second means is fixed to a connecting block, third means including plural bimorph-type piezoelectric displacement generating elements, one end of each of said elements of said third means being respectively connected to the connecting blocks connected to said elements of said first and second means, said elements of said third means having a displacement force transmitting adapter in substantially the center thereof.

* * * * *